(12) United States Patent
Asano et al.

(10) Patent No.: US 8,184,224 B2
(45) Date of Patent: May 22, 2012

(54) DISPLAY APPARATUS AND METHOD OF LAYING OUT PIXEL CIRCUITS

(75) Inventors: Mitsuru Asano, Kanagawa (JP);
Seiichiro Jinta, Kanagawa (JP);
Masatsugu Tomida, Kanagawa (JP);
Hiroshi Fujimura, Aichi (JP)

(73) Assignee: Sony Corporation, Tokyo (JP)

( * ) Notice: Subject to any disclaimer, the term of this patent is extended or adjusted under 35 U.S.C. 154(b) by 1315 days.

(21) Appl. No.: 11/878,511

(22) Filed: Jul. 25, 2007

(65) Prior Publication Data

US 2008/0029768 A1 Feb. 7, 2008

(30) Foreign Application Priority Data

Aug. 2, 2006 (JP) ................................. 2006-210621

(51) Int. Cl.
*G02F 1/136* (2006.01)

(52) U.S. Cl. ............. 349/43; 349/42; 349/48; 349/69; 257/59; 257/72; 257/213; 257/347; 257/E27.009; 257/E27.113; 315/169.1; 315/169.3; 345/55; 345/76; 345/77; 345/204; 345/211; 348/222.1; 348/308

(58) Field of Classification Search .................... 257/59, 257/72, 213, 303, 347, E27.009, E27.113; 349/42, 44, 49, 139; 315/169.1, 169.3; 313/500, 313/505; 345/55, 76, 77, 98, 204, 211, 690; 348/222.1, 308

See application file for complete search history.

(56) References Cited

U.S. PATENT DOCUMENTS

| | | | |
|---|---|---|---|
| 7,122,835 B1 * | 10/2006 | Ikeda et al. | 257/72 |
| 2001/0002703 A1 * | 6/2001 | Koyama | 257/40 |
| 2002/0001886 A1 * | 1/2002 | Ohtani | 438/151 |
| 2002/0134983 A1 * | 9/2002 | Yamazaki | 257/72 |
| 2004/0056296 A1 * | 3/2004 | Arao et al. | 257/303 |
| 2004/0115989 A1 * | 6/2004 | Matsueda et al. | 439/577 |
| 2005/0264498 A1 * | 12/2005 | Asano | 345/76 |

FOREIGN PATENT DOCUMENTS

| | | |
|---|---|---|
| JP | 2000-208774 | 7/2000 |
| JP | 2001-076872 A | 3/2001 |
| JP | 2001-291870 | 10/2001 |
| JP | 2003-317961 A | 11/2003 |
| JP | 2004-086014 A | 3/2004 |
| JP | 2005-108528 | 4/2005 |
| JP | 2005-345722 | 12/2005 |

OTHER PUBLICATIONS

Japanese Office Action issued Dec. 27, 2011 for corresponding Japanese Application No. 2006-210621.

* cited by examiner

*Primary Examiner* — Meiya Li
(74) *Attorney, Agent, or Firm* — Rader, Fishman & Grauer PLLC

(57) ABSTRACT

Herein disclosed a display apparatus including: a pixel array having a matrix of pixel circuits each including respective electrooptical elements for determining a display brightness level and respective drive circuits for driving the electrooptical elements; wherein adjacent two of the pixel circuits are paired with each other, and each of the drive circuits of the adjacent two pixel circuits includes at least one transistor having a low-concentration source/drain region or an offset region of an offset gate structure, the electrooptical elements and the drive circuits of the adjacent two pixel circuits being laid out such that a line interconnecting a drain region and a source region of the at least one transistor extends parallel to a direction of pixel columns of the pixel circuits of the pixel array.

16 Claims, 10 Drawing Sheets

FIG.6

| PIXEL CIRCUIT (1,1) F (R) | PIXEL CIRCUIT (1,2) ꓞ (G) | PIXEL CIRCUIT (1,3) F (B) | PIXEL CIRCUIT (1,4) ꓞ (R) |
|---|---|---|---|
| PIXEL CIRCUIT (2,1) F (R) | PIXEL CIRCUIT (2,2) ꓞ (G) | PIXEL CIRCUIT (2,3) F (B) | PIXEL CIRCUIT (2,4) ꓞ (R) |
| PIXEL CIRCUIT (3,1) F (R) | PIXEL CIRCUIT (3,2) ꓞ (G) | PIXEL CIRCUIT (3,3) F (B) | PIXEL CIRCUIT (3,4) ꓞ (R) |

LDD REGION IS SHIFTED TO
RIGHT RELATIVELY TO CHANNEL
→

DIRECTION X OF PIXEL ROWS

DISPLAY APPARATUS AND METHOD OF LAYING OUT PIXEL CIRCUITS

CROSS REFERENCES TO RELATED APPLICATIONS

The present invention contains subject matter related to Japanese Patent Application JP 2006-210621 filed in the Japan Patent Office on Aug. 2, 2006, the entire contents of which being incorporated herein by reference.

BACKGROUND OF THE INVENTION

1. Field of the Invention

The present invention relates to a display apparatus and a method of laying out pixel circuits to a panel-type display apparatus, and a method of laying out pixel circuits in such a panel-type display apparatus.

2. Description of the Related Art

Recently in the field of display apparatus, panel-type display apparatus such as LCD (Liquid Crystal Display) panels, EL (Electro Luminescence) display panels, PDPs (Plasma Display Panels), etc. has been becoming the mainstream, replacing existing CRT (Cathode-Ray Tube) display apparatus because of their thin, lightweight, and high-definition properties.

Of the panel-type display apparatus, active-matrix display apparatus incorporating active elements in pixel circuits which include electrooptical elements are capable of giving high functionality to the pixel circuits as the pixel circuits may be constructed of TFTs (Thin Film Transistors).

Generally, active-matrix display apparatus with TFT pixel circuits include correcting circuits combined with the pixel circuits, respectively, for correcting variations of TFT characteristics such as threshold voltages Vth. See, for example, Japanese Patent Laid-open No. 2005-345722.

The correcting circuits combined with the pixel circuits, however, tend to increase the number of power supply lines for supplying a power supply voltage to the pixel circuits. The increased number of power supply lines poses a limitation on the area of the layout of pixels, which presents an obstacle to efforts for achieving a higher definition display capability by employing more pixels in the display apparatus.

It has been attempted to place a power, supply line between two adjacent pixel circuits that are laid out symmetrically with respect to the power supply line to share the power supply line. The area of the layout of the pixel circuits is thus reduced for a higher definition display capability. See, for example, Japanese Patent Laid-open No. 2005-108528.

If transistors that make up pixel circuits are N-channel MOS transistors, then it is the general practice to employ a low-concentration source/drain structure such as an LDD (Lightly Doped Drain) structure, a DDD (Double Diffused Drain) structure, a GDD (Graded Doped Drain) structure, or an offset gate structure for relaxing a drain electric field to increase the withstand voltage and reducing a leakage. See, for example, Japanese Patent Laid-open No. 2000-208774. Details of the LDD structure will be described below. The other structures may also be similarly analyzed.

With the LDD structure, the N-channel MOS transistor can essentially be considered to be an equivalent to a transistor with resistors connected respectively to the source and the drain thereof. According to an example, the LDD region is determined by patterning a resist in the shape of a gate, and the source/drain region is determined by patterning a resist with a source/drain forming resist mask. See, for example, Japanese Patent Laid-open No. 2001-291870.

When a transistor having the LDD structure is fabricated, since the LDD region and the source/drain region are formed by respective independent processes, it is predicted that the lengths of these regions will vary independently of each other. Actually, if the length of the LDD region varies and becomes greater than a prescribed length, then the LDD region will have a resistance value greater than a prescribed value. If the length of the LDD region becomes smaller than the prescribed length, then the resistance value of the LDD region will be smaller than the prescribed value.

As shown in FIG. 10 of the accompanying drawings, if the LDD region on the drain side becomes longer (the resistance value thereof becomes greater), then the LDD region on the source side becomes shorter (the resistance value thereof becomes smaller). Conversely, if the LDD region on the drain side becomes shorter (the resistance value thereof becomes smaller), then the LDD region on the source side becomes longer (the resistance value thereof becomes greater).

With a view to reducing the area of the layout of pixel circuits, it is proposed, as shown in FIG. 11 of the accompanying drawings, to lay out two pixel circuits 200A, 200B symmetrically with respect to a power supply line 100.

For laying out the two pixel circuits 200A, 200B symmetrically, a layout structure may be considered to have drive transistors (TFTs) 202A, 202B for driving electrooptical elements 201A, 201B arranged such that drain regions (D) are positioned closely to the power supply line 100 and source regions (S) remotely from the power supply line 100, i.e., a line P interconnecting the drain regions (D) and the source regions (S) extends parallel to the direction of the array of the two pixel circuits 200A, 200B (the direction of pixel rows).

When the positional relationship between the LDD structures and the channels suffers variations in the above layout structure, since the variations are in the same direction with respect to the two drive transistors 202A, 202B, if the LDD region on the drain side of the drive transistor 202A becomes longer and the LDD region on the source side thereof becomes shorter, then the LDD region on the drain side of the drive transistor 202B becomes shorter and the LDD region on the source side thereof becomes longer.

As the LDD regions are thus shifted due to the variations in the positional relationship between the LDD structures and the channels, the resistance values of the LDD regions differ on the drain side and the source side. If the different resistance values are opposite to each other between the two drive transistors 202A, 202B, then the transistor characteristics TFT characteristics of the drive transistors 202A, 202B suffer variations. The pixel-to-pixel variations of the transistor characteristics due to the shifts of the LDD regions are characteristic variations that cannot be corrected by the above correcting circuits.

Though the problems of transistors having the LDD structure have been described above, the problems are not limited to such transistors having the LDD structure, but also hold true for all transistors having low-concentration source/drain regions such as transistors having the DDD structure and the GDD structure, and transistors having offset regions of the offset gate structure.

SUMMARY OF THE INVENTION

In the present invention, it is desirable to provide a display apparatus which is free of pixel-to-pixel variations of transistor characteristics due to shifts of low-concentration source/drain regions or offset regions of an offset gate structure, while being capable of displaying high-quality images free of quality deteriorations due to such pixel-to-pixel variations, and a method of laying out pixel circuits for allowing such a panel-type display apparatus to display high-quality images.

In the present invention, there is provided in accordance with the present invention a display apparatus including a pixel array having a matrix of pixel circuits each having respective electrooptical elements for determining a display brightness level and respective drive circuits for driving the electrooptical elements. Two of the adjacent pixel circuits are paired with each other, and each of the drive circuits of the two adjacent pixel circuits includes at least one transistor having a low-concentration source/drain region or an offset region of an offset gate structure. The electrooptical elements and the drive circuits of the two adjacent pixel circuits are laid out such that a line interconnecting a drain region and a source region of the at least one transistor extends parallel to a direction of pixel columns of the pixel circuits in the pixel array.

In the display apparatus of the above construction, if the transistor having the low-concentration source/drain region or the offset region of the offset gate structure is a transistor having the LDD structure, for example, then the two adjacent pixel circuits are paired with each other, and symmetrical circuit components of the two pixel circuits are laid out such that a line interconnecting a drain region and a source region of the transistor having the LDD structure extends parallel to the direction of pixel columns of the pixel circuits. Even if the resistance values of the LDD regions on the drain and source sides are different when the LDD regions are shifted due to a variation of the positional relationship between the LDD structure and the channel, the different resistance values occur identically in the transistors of the two pixel circuits.

Specifically, if the LDD region on the drain side of the transistor of one of the pixel circuits becomes longer (the resistance value thereof becomes greater) and the LDD region on the source side thereof becomes shorter (the resistance value thereof becomes smaller), then the LDD region on the drain side of the transistor of the other pixel circuit also becomes longer and the LDD region on the source side thereof also becomes shorter. Conversely, if the LDD region on the drain side of the transistor of one of the pixel circuits becomes shorter and the LDD region on the source side thereof becomes longer, then the LDD region on the drain side of the transistor of the other pixel circuit also becomes shorter and the LDD region on the source side thereof also becomes longer. Consequently, pixel-to-pixel variations of the characteristics of the transistors due to the shifts of the LDD regions are eliminated.

According to the present invention, two adjacent pixel circuits are paired with each other, and circuit components that are symmetrical of the two pixel circuits are laid out to eliminate pixel-to-pixel variations of the characteristics of the transistors due to the shifts of the low-concentration source/drain regions or the offset regions of the offset gate structures. The resultant display apparatus is capable of displaying images of a high image quality free of quality deteriorations due to such pixel-to-pixel variations.

The advantages of the present invention will become apparent from the following description when the above features are taken in conjunction with the accompanying drawings which illustrate preferred embodiments of the present invention by way of example.

BRIEF DESCRIPTION OF THE DRAWINGS

FIG. 6 is a diagram showing the layouts of pixel circuits in the striped array;

DETAILED DESCRIPTION OF THE PREFERRED EMBODIMENTS

Figure 1:
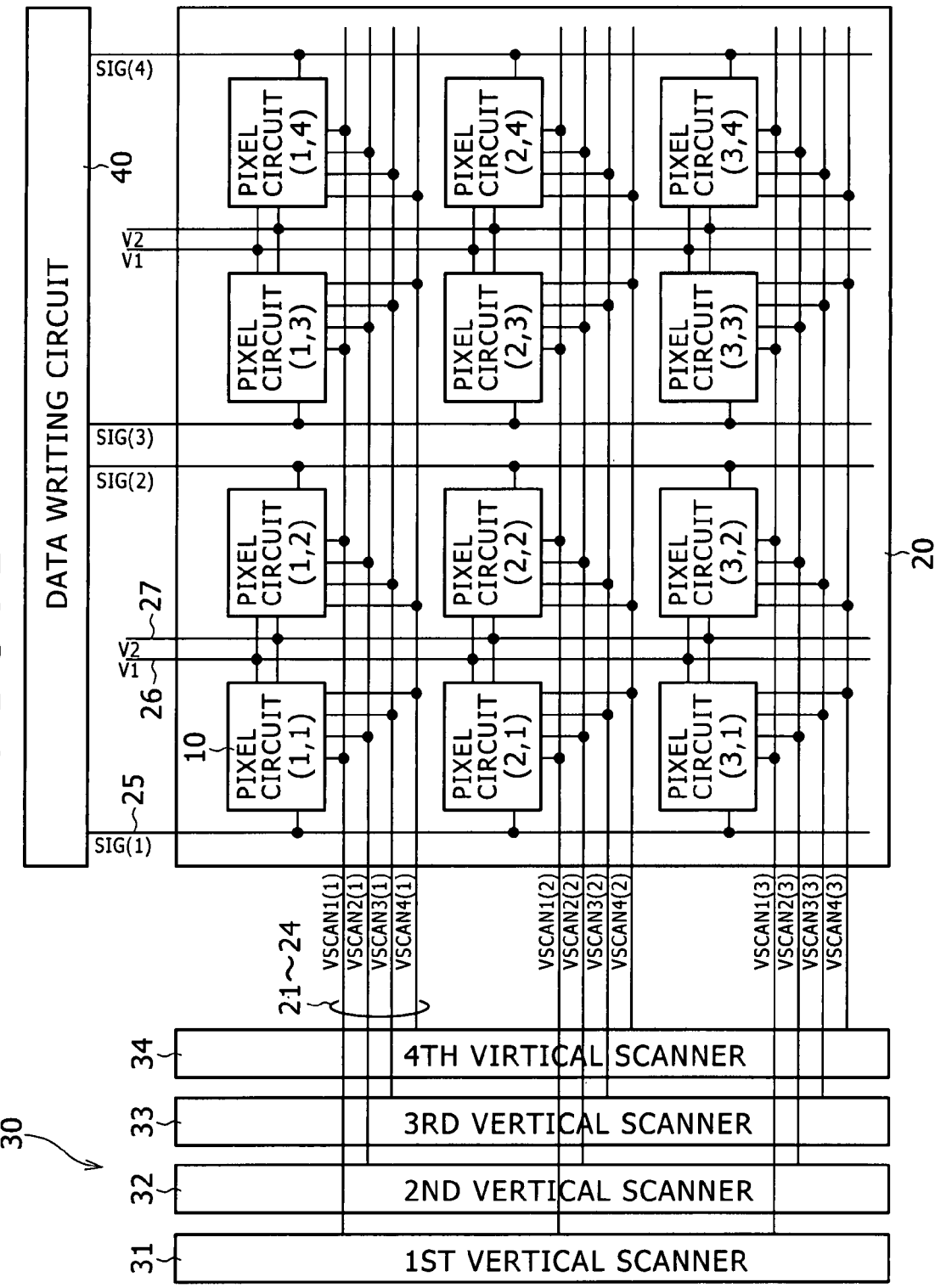
FIG. 1 is a block diagram of an active-matrix display apparatus according to an exemplary embodiment of the present invention.

FIG. 1 shows in block form an active-matrix display apparatus according to an exemplary embodiment of the present invention.

As shown in FIG. 1, the active-matrix display apparatus according to the exemplary embodiment includes a pixel array 20 made up of a two-dimensional matrix of pixel circuits 10 having electrooptical elements for determining display brightness levels, a vertical scanning circuit 30 for selectively scanning pixel rows of pixel circuits 10 of the pixel array 20, and a data writing circuit 40 for writing data signals (brightness data) SIG into the pixel circuits 10 of the pixel row selected by the vertical scanning circuit 30.

Specific circuit details of the pixel circuits 10 will be described later. For the sake of brevity, the pixel array 20 is shown as having pixel circuits 1 arranged in a matrix of three pixel rows and four pixel columns. Each of the pixel rows of pixel circuits 10 is combined with four scanning lines 21 through 24, and each of the pixel columns of pixel circuits 10 is combined with a data line (signal line) 25 along with two power supply lines 26, 27 for supplying power supply potentials V1, V2, for example.

The pixel array 20 is usually formed on a transparent insulating substrate, such as a glass substrate or the like, providing a flat panel structure. Each of the pixel circuits 10 of the pixel array 20 includes an amorphous TFT (Thin-Film Transistor) or a low-temperature polysilicon TFT. If each of the pixel circuits 10 includes a low-temperature polysilicon TFT, then the vertical scanning circuit 30 and the data writing circuit 40 are also integrally formed on the panel of the pixel array 20.

The vertical scanning circuit 30 includes first through fourth vertical (V) scanners 31 through 34 associated respectively with the four scanning lines 21 through 24. The first through fourth vertical scanners 31 through 34 include shift registers, for example, and output respective to the first through fourth scanning pulses VSCAN1 through VSCAN4 at their respective times. The first through fourth scanning pulses VSCAN1 through VSCAN4 are supplied to the pixel rows of pixel circuits 10 in pixel array 20 through the scanning lines 21 through 24.

(Pixel Circuits)

Figure 2:
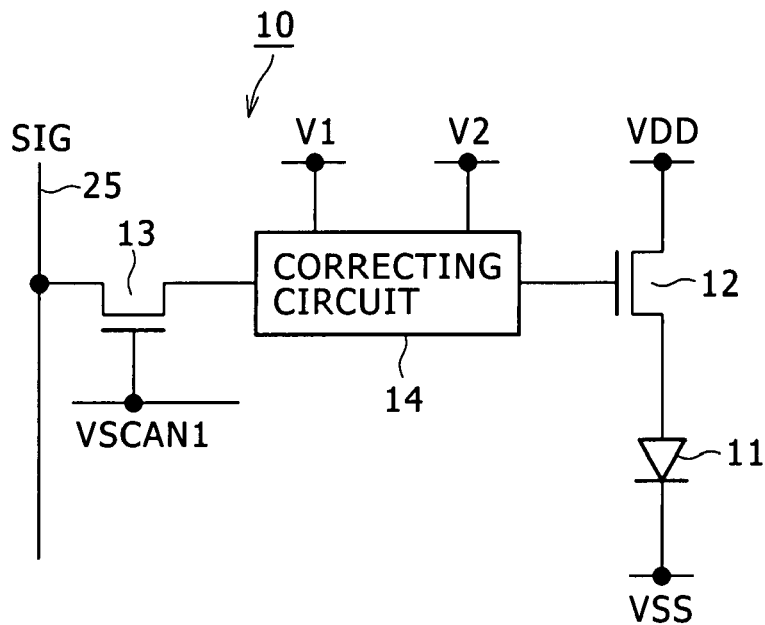
FIG. 2 is a circuit diagram showing a basic arrangement of a pixel circuit.

FIG. 2 shows a basic arrangement of each of the pixel circuits 10. As shown in FIG. 2, the pixel circuit 10 includes an organic EL element 11, as an electrooptical element for determining a display brightness level, and changing its light emission brightness level depending on the current flowing through, drive transistor 12 and a write transistor 13, (serve as active elements for driving the organic EL element 11), and a correcting circuit 14. The drive transistor 12, the write transistor 13, and the correcting circuit 14 jointly make up a drive circuit for driving the organic EL element 11.

The organic EL element 11 includes a cathode electrode connected to a power supply potential VSS (e.g., ground potential GND). The drive transistor 12, which may include an N-channel TFT, is connected between a power supply potential VDD (e.g., a positive power supply potential) and the anode electrode of the organic EL element 11. The drive transistor 12 supplies the organic EL element 11 with a drive current depending on the signal potential of the data signal SIG that is written by the write transistor 13.

The write transistor 13, which may include an N-channel TFT, is connected between the data line 25 and the correcting circuit 14. When the scanning pulse VSCAN1 output from the first vertical scanner 31, shown in FIG. 1, is applied to the gate of the write transistor 13, the write transistor 13 samples the data signal SIG and write the sampled data signal SIG into the pixel circuit 10. The correcting circuit 14 operates under the power supply potentials V1, V2 supplied through the two power supply lines 26, 27 to correct variations per pixel in the threshold voltage Vth and mobility µ of the drive transistor 12.

The power supply potentials under which the correcting circuit 14 operates are not necessarily limited to the power supply potentials V1, V2, but may be the power supply potential VDD and the power supply potential VSS, for example.

Figure 3:
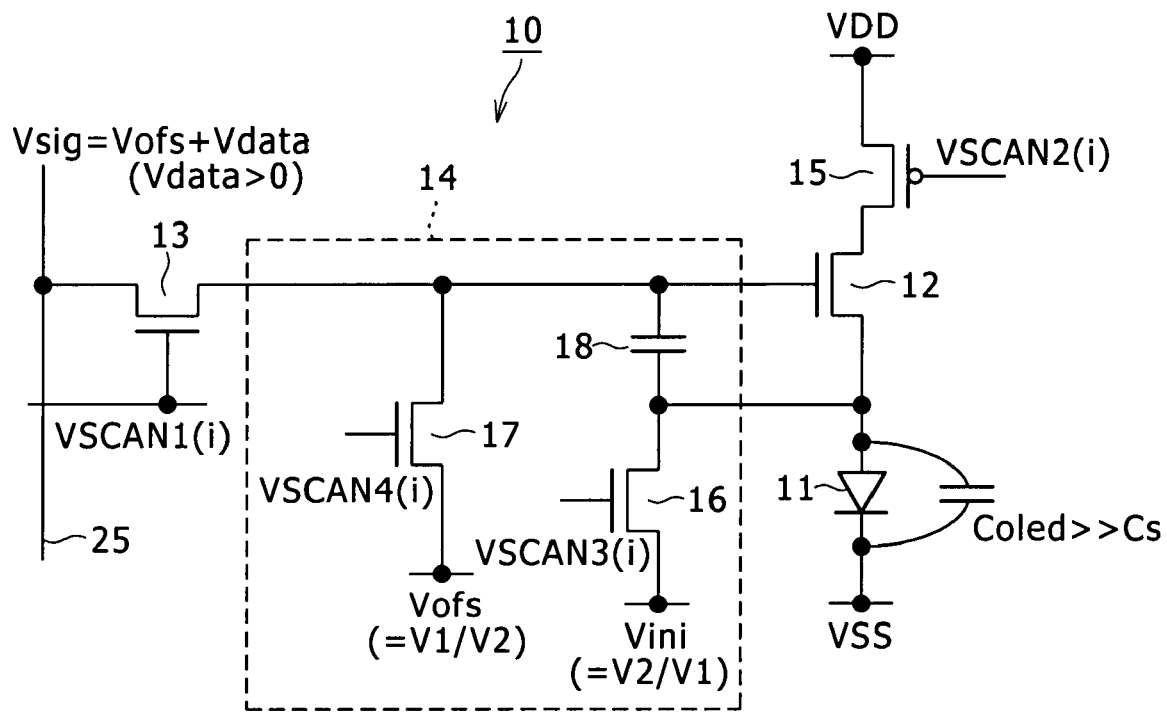
FIG. 3 is a circuit diagram showing a specific arrangement of the pixel circuit.

FIG. 3 shows a specific arrangement of the pixel circuit 10. As shown in FIG. 3, the pixel circuit 10 includes three switching transistors 15, 16, 17, a capacitor 18, as well as the organic EL element 11, the drive transistor 12, and the write transistor 13.

The switching transistor 15, which may include a P-channel TFT, for example, has a source connected to the power supply potential VDD, a drain connected to the drain of the drive transistor 12, and a gate to which the scanning pulse VSCAN2 output from the second vertical scanner 32 shown in FIG. 1 is applied. The switching transistor 16, which may include an N-channel TFT, for example, has a drain connected to a junction node between the source of the drive transistor 12 and the anode electrode of the organic EL element 11, a source connected to a power supply potential Vini, and a gate to which the scanning pulse VSCAN3 output from the third vertical scanner 33 shown in FIG. 1 is applied.

The switching transistor 17, which may include an N-channel TFT, for example, has a drain connected to a power supply potential Vofs, a source connected to the drain of the write transistor 13 (the gate of the drive transistor 12), and a gate to which the scanning pulse VSCAN4 output from the fourth vertical scanner 34 shown in FIG. 1 is applied. The capacitor 18 has an end connected to a junction node between the gate of the drive transistor 12 and the drain of the write transistor 13, with the other end connected to a junction node between the source of the drive transistor 12 and the anode electrode of the organic EL element 11.

The switching transistors 16, 17, and the capacitor 18 jointly make up the correcting circuit 14 shown in FIG. 3, i.e., a circuit for correcting variations per pixel in the threshold voltage Vth and mobility µ of the drive transistor 12. The correcting circuit 14 is supplied with the power supply potentials V1, V2 through the two power supply lines 26, 27. The power supply potential V2 (or the power supply potential V1) is used as the power supply potential Vini, and the power supply potential V1 (or the power supply potential V2) is used as the power supply potential Vofs.

In the specific arrangement shown in FIG. 3, the drive transistor 12, the write transistor 13, the switching transistors 16 and 17 include N-channel TFTs, while the switching transistor 15 includes a P-channel TFT. The combination of the conductivity types of the drive transistor 12, the write transistor 13, and the switching transistors 15, 16, 17 is given by way of example only, and these transistors are not limited to the illustrated conductivity types.

The components of the pixel circuit 10 which are connected as described above operate as follows:

When the write transistor 13 is rendered conductive, it samples a signal voltage Vsig (=Vofs+Vdata; Vdata>0) of the data signal SIG supplied through the data line 25. The sampled signal voltage Vsig is held by the capacitor 18. When the switching transistor 15 is rendered conductive, it supplies a current from the power supply potential VDD to the drive transistor 12.

While the switching transistor 15 is being conductive, the drive transistor 12 supplies a current value depending on the signal voltage Vsig held by the capacitor 18 to the organic EL element 11, thereby driving the organic EL element 11 (current drive). When the switching transistors 16, 17 are rendered conductive, they detect the threshold voltage Vth of the drive transistor 12 before the organic EL element 11 is driven, and holds the detected threshold voltage Vth in the capacitor 18 in order to cancel the effect of the threshold voltage Vth.

As a condition for guaranteeing normal operation of the pixel circuit 10, the third power supply potential Vini is set to a level which is obtained by subtracting the threshold voltage Vth of the drive transistor 12 from the fourth power supply potential Vofs. In other words, the levels of the third power supply potential Vini, the threshold voltage Vth, and the fourth power supply potential Vofs are related to each other as Vini<Vofs−Vth. In addition, a level which represents the sum of the cathode potential Vcat (the ground potential GND in FIG. 3) of the organic EL element 11 and the threshold voltage Vthel of the organic EL element 11 is higher than the level obtained by subtracting the threshold voltage Vth of the drive transistor 12 from the fourth power supply potential Vofs. In other words, the levels of the cathode potential Vcat, the threshold voltage Vthel, the fourth power supply potential Vofs, the threshold voltage Vth, and the third power supply potential Vini are related to each other as Vcat+Vthel>Vofs−Vth (>Vini).

Circuit operation of the active-matrix display apparatus which is in the form of a two-dimensional matrix of pixel circuits 10 will be described below with reference to a timing waveform chart shown in FIG. 4. In the timing waveform chart shown in FIG. 4, the period from time t1 to time t9 represents a one-field period. During the one-field period, the pixel rows of the pixel array 20 are sequentially scanned each once.

Figure 4:
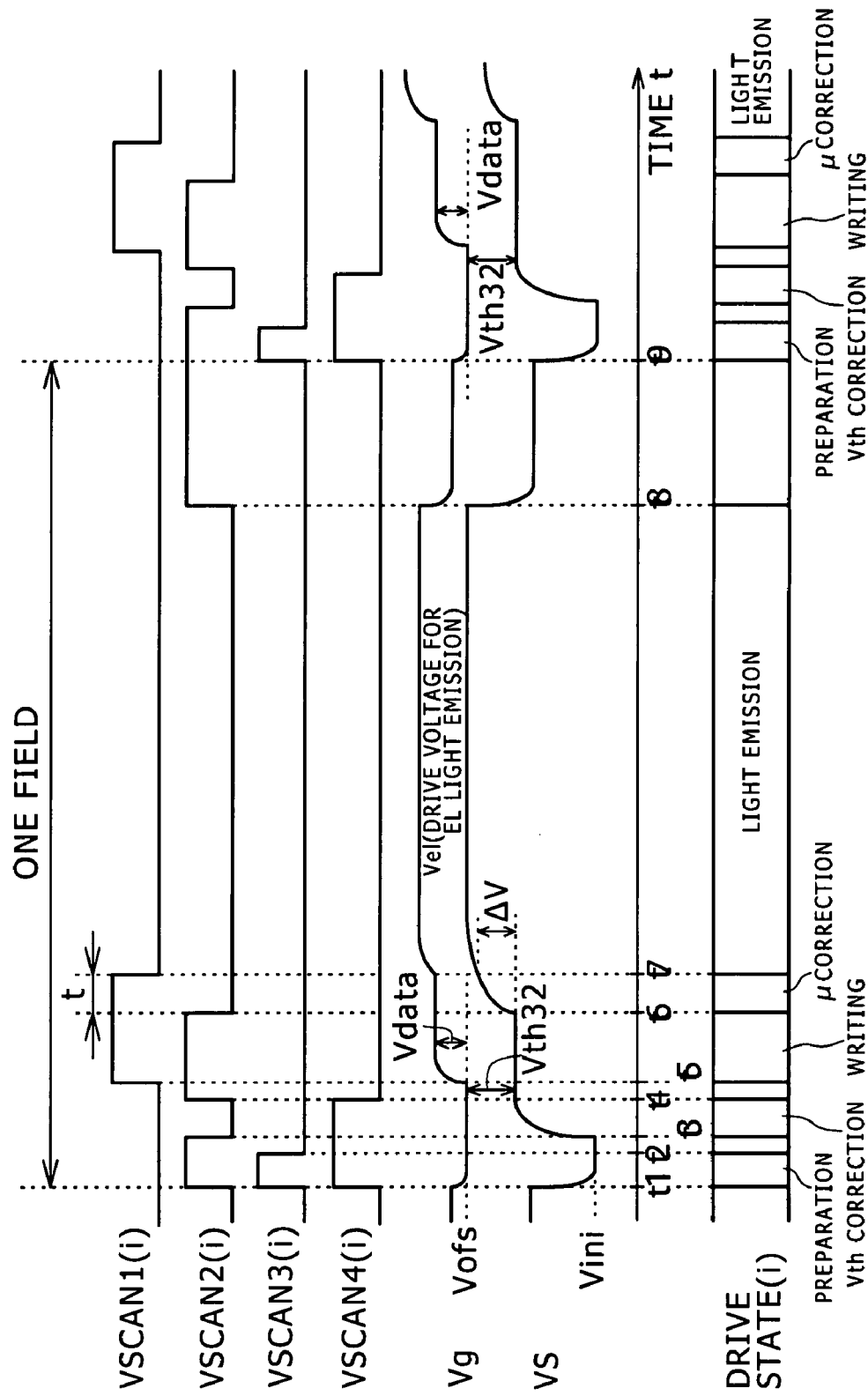
FIG. 4 is a timing waveform chart showing the timing relationship between a write signal WS, a drive signal DS, and first and second correcting scanning signals AZ1, AZ2, and changes in a gate potential Vg and a source potential Vs of a drive transistor.

FIG. 4 shows the timing relationship between scanning pulses VSCAN1 through VSCAN4 that are applied to the pixel circuits 10 through the first through fourth scanning lines 21 through 24 and changes in a gate potential Vg and a source potential Vs of the drive transistor 12 when the pixel circuits 10 of a ith pixel row are driven.

Since the write transistor 13 and the switching transistors 16, 17 are of the N-channel type, the state of a high level (the power supply potential VDD; hereinafter referred to as "H level") of the first scanning pulse VSCAN1 and the third and fourth scanning pulses VSCAN3, VSCAN4 are referred to as an active state. The state of a low level (the power supply potential VSS (GND level); hereinafter referred to as "N level") is referred to as an inactive state. Since the switching transistor 15 is of the P-channel type, the state of the "L" level of the second scanning pulse VSCAN2 is referred to as an active state, and the state of the "H" level thereof is referred to as an inactive state.

(Light Emission Period)

In an ordinary light emission period (t7 to t8), as the first scanning pulse VSCAN1 output from the first vertical scanner 31, the second scanning pulse VSCAN2 output from the second vertical scanner 32, and the third and fourth scanning pulses VSCAN3, VSCAN4 output from the third and fourth vertical scanners 33 and 34, which are of the "L" level. The third and fourth switching transistors 16, 17 are nonconductive (off) and the switching transistor 15 is conductive (on).

At this time, the drive transistor 12 operates as a constant current source because it is designed to operate in a saturated range. As a result, the drive transistor 12 supplies a constant drain-to-source current Ids expressed by the equation (1) below to the organic EL element 11 through the switching transistor 15.

$$Ids = (\tfrac{1}{2}) \cdot \mu(W/L)Cox(Vgs-Vth)^2 \qquad (1)$$

where Vth represents the threshold voltage of the drive transistor 12, μ the mobility, W the channel width, L the channel length, Cox the gate capacitance per unit area, and Vgs the gate-to-source voltage.

When the second scanning pulse VSCAN2 changes from the "L" level to the "H" level, the switching transistor 15 is rendered nonconductive to stop the light emission from the organic EL element 11. The pixel circuits 10 now enter a non-light emission period.

(Threshold Correction Preparing Period)

While the switching transistor 15 is being nonconductive, when the third and fourth scanning pulses VSCAN3, VSCAN4 output from the third and fourth vertical scanners 33, 34 change from the "L" level to the "H" level at time t1 (t9), the switching transistors 16, 17 are rendered conductive. The pixel circuits 10 now enters a threshold correction preparing period for correcting (canceling) a variation of the threshold voltage Vth of the drive transistor 12 as described later.

Either one of the switching transistors 16, 17 may be rendered conductive earlier than the other. When switching transistors 16, 17 are rendered conductive, the power supply potential Vofs is applied through the switching transistor 17 to the gate of the drive transistor 12, and the power supply potential Vini is applied through the switching transistor 16 to the source of the drive transistor 12 (the anode electrode of the organic EL element 11).

At this time, because of the level relationship Vini<Vcat+Vthel, the organic EL element 11 is reversely biased. Therefore, no current flows through the organic EL element 11, and no light is emitted therefrom. The gate-to-source voltage Vgs of the drive transistor 12 has a value represented by Vofs−Vini. This value satisfies the level relationship Vofs−Vini>Vth.

At time t2, the third scanning pulse VSCAN3 output from the third vertical scanner 33 changes from the "H" level to the "L" level, rendering the switching transistor 16 nonconductive, whereupon the threshold correction preparing period is finished.

(Threshold Correcting Period)

Thereafter, at time t3, the second scanning pulse VSCAN2 output from the second vertical scanner 32 changes from "H" level to the "L" level, rendering the switching transistor 15 conductive. When the switching transistor 15 is rendered conductive, a current flows through a path from the power supply potential VDD to the switching transistor 15 to the capacitor 18 to the switching transistor 17 to the power supply potential Vofs.

At this time, the gate potential Vg of the drive transistor 12 is kept as the power supply potential Vofs, allowing the current to flow continuously through the above path until the drive transistor 12 is cut off, i.e., it changes from the conductive state to the nonconductive state. At this time, the source potential Vs of the drive transistor 12 gradually rises with time from the power supply potential Vini.

When the gate-to-source voltage Vgs of the drive transistor 12 reaches the threshold voltage Vth of the drive transistor 12 upon elapse of a certain time, the drive transistor 12 is cut off. The potential difference Vth between the gate and source of the drive transistor 12 is held as a threshold correcting potential in the capacitor 18. At this time, Vel=Vofs−Vth<Vcat+Vthel.

Thereafter, at time t4, the second scanning pulse VSCAN2 output from the second vertical scanner 32 changes from "L" level to the "H" level, and the fourth scanning pulse VSCAN4 output from the fourth vertical scanner 34 changes from the "H" level to the "L" level, rendering the switching transistors 15, 17 nonconductive. The period from time t3 to time t4 serves as a period for detecting the threshold voltage Vth of the drive transistor 12. The detecting period t3 to t4 is called a threshold correcting period.

When the switching transistors 15, 17 are rendered nonconductive at time t4, the threshold correcting period is finished. At this time, if the switching transistor 15 is rendered nonconductive earlier than the switching transistor 17, it is possible to prevent the gate voltage Vg of the drive transistor 12 from varying.

(Writing Period)

Thereafter, at time t5, the first scanning pulse VSCAN1 output from the first vertical scanner 31 changes from "L" level to the "H" level, rendering the write transistor 13 conductive. The pixel circuits 10 now enters a period for writing the input signal voltage Vsig. In this writing period, the input signal voltage Vsig is sampled by the write transistor 13 and written into the capacitor 18.

The organic EL element 11 has a capacitive component. If the capacitance value of the capacitive component of the organic EL element 11 is represented by Coled, the capacitance value of the capacitor 18 by Cs, and the capacitance value of the parasitic capacitance of the drive transistor 12 by Cp, then the gate-to-source voltage Vgs of the drive transistor 12 is determined by the following equation (2):

$$Vgs = \{Coled/(Coled+Cs+Cp)\}(Vsig-Vofs)+Vth \qquad (2)$$

Generally, the capacitance value Coled of the capacitive component of the organic EL element 11 is sufficiently greater than the capacitance value Cs of the capacitor 18 and the parasitic capacitance value Cp of the drive transistor 12. Therefore, the gate-to-source voltage Vgs of the drive transistor 12 is essentially expressed as (Vsig−Vfs)+Vth. Furthermore, since the capacitance value Cs of the capacitor 18 is sufficiently smaller than the capacitance value Coled of the capacitive component of the organic EL element 11, most of the signal voltage Vsig is written into the capacitor 18. More precisely, the difference Vsig−Vini between the signal voltage Vsig and the source potential Vs of the drive transistor 12, i.e. the power supply potential Vini, is written as a data voltage Vdata.

At this time, the data voltage Vdata (=Vsig−Vini) is held in the capacitor 18 as being added to the threshold voltage Vth held in the capacitor 18. In other words, the voltage held in the capacitor 18, i.e., the gate-to-source voltage Vgs of the drive transistor 12, is represented by Vsig−Vini+Vth. If Vini=0 V for the sake of brevity, then the gate-to-source voltage Vgs is represented by Vsig+Vth. Inasmuch as the threshold voltage Vth is held in advance in the capacitor 18, it is possible to correct a variation or a time-dependent change of the threshold voltage Vth, as described below.

Specifically, with the threshold voltage Vth being held in advance in the capacitor 18, when the drive transistor 12 is driven by the signal voltage Vsig, the threshold voltage Vth of the drive transistor 12 is canceled out by the threshold voltage Vth held in the capacitor 18. Stated otherwise, since the threshold voltage Vth is corrected, even if the threshold voltage Vth per pixel suffers a variation or a time-dependent change, the light emission brightness level of the organic EL element 11 is kept constant regardless of such a variation or a time-dependent change.

(Mobility Correcting Period)

While the first scanning pulse VSCAN1 is in the "H" level, when the second scanning pulse VSCAN2 output from the second vertical scanner 32 changes from the "H" level to the "L" level at time t6, the switching transistor 15 is rendered conductive whereupon the data writing period is finished. The pixel circuits 10 now enters a mobility correcting period for correcting a variation in the mobility μ of the drive transistor 12. The mobility correcting period is a period wherein the active period ("H" level period) of the first scanning pulse VSCAN1 and the active period ("H" level period) of the second scanning pulse VSCAN2 overlap each other.

When the switching transistor 15 is rendered conductive, a current starts to be supplied from the power supply potential VDD to the drive transistor 12. Therefore, the pixel circuits 10 shifts from the non-light emission period to the light emission period. During a period in which the write transistor 13 is still conductive, i.e. a period t6 to t7 in which a latter part of the sampling period and a former part of the light emission period overlap each other, a mobility correction is carried out to cancel the dependency of the drain-to-source current Ids of the drive transistor 12 on the mobility μ.

In the period t6 to t7, which is the former part of the light emission period for carrying out the mobility correction, the drain-to-source current Ids flows in the drive transistor 12 while the gate potential Vg of the drive transistor 12 is being secured to the signal potential Vsig. At this time, if Vofs−Vth<Vthel, then the organic EL element 11 is reversely biased. Consequently, the organic EL element 11 does not emit light even if the pixel circuits 10 are in the light emission period.

In the mobility correction period t6 to t7, as the organic EL element 11 is reversely biased, the organic EL element 11 exhibits simple capacitance characteristics rather than diode characteristics. Therefore, the drain-to-source current Ids flowing in the drive transistor 12 is written into a capacitance C (=Cs+Coled) which represents the combination of the capacitance value Cs of the capacitor 18 and the capacitance value Coled of the capacitive component of the organic EL element 11. As the drain-to-source current Ids is written into the capacitance C, the source potential Vs of the drive transistor 12 increases. In the timing waveform chart shown in FIG. 4, the increase of the source potential Vs is represented by ΔV.

Since the increase ΔV of the source potential Vs acts to be subtracted from the gate-to-source voltage Vgs of the drive transistor 12 which is held across the capacitor 18 to discharge the electric charges stored in the capacitor 18, a negative feedback loop applies. The increase in ΔV of the source potential Vs thus represents the feedback variable of the negative feedback loop. At this time, the gate-to-source voltage Vgs is represented by Vsig−ΔV+Vth. When the drain-to-source current Ids flowing in the drive transistor 12 is input to the gate of the drive transistor 12, i.e., is supplied through the negative feedback loop against the gate-to-source voltage Vgs, it is possible to correct a variation in the mobility μ of the drive transistor 12.

(Light Emission Period)

At time t7, the first scanning pulse VSCAN1 output from the first vertical scanner 31 goes to the "L" level, rendering the write transistor 13 nonconductive. The mobility correcting period is finished, and the pixel circuits 10 enter a light emission period. As a result, the gate of the drive transistor 12 is disconnected from the data line 25, with the signal voltage Vsig being no longer applied thereto. The gate potential Vg of the drive transistor 12 rises together with the source potential Vs thereof. During the rise of the gate potential Vg, the gate-to-source voltage Vgs held across the capacitor 18 keeps the value of Vsig−ΔV+Vth.

As the source potential Vs of the drive transistor 12 rises, the organic EL element 11 is brought out of the reversely biased state. When the drain-to-source current Ids flows from the drive transistor 12 into the organic EL element 11, the organic EL element 11 starts to emit light.

The relationship between the drain-to-source current Ids and the gate-to-source voltage Vgs at this time is expressed by the equation (3) below which is produced by substituting Vsig−ΔV+Vth for Vgs in the above equation (1).

$$Ids = k\mu(Vgs - Vth)^2 \quad (3)$$
$$= k\mu(Vsig - \Delta V)^2$$
where
$$k = (1/2)(W/L)Cox.$$

As can be seen from the equation (3), the term of the threshold voltage Vth of the drive transistor 12 is canceled, and the drain-to-source current Ids supplied from the drive transistor 12 to the organic EL element 11 does not depend on the threshold voltage Vth of the drive transistor 12. Basically, the drain-to-source current Ids is determined by the input signal voltage Vsig. Stated otherwise, the organic EL element 11 is not affected by a variation or a time-dependent change in the threshold voltage Vth of the drive transistor 12, and emits light at a brightness level depending on the input signal voltage Vsig.

The equation (3) also indicates that the input signal voltage Vsig is corrected by the feedback variable ΔV that is developed when the drain-to-source current Ids is applied to the gate of the drive transistor 12 through the negative feedback loop. The feedback variable ΔV acts to cancel out the effect of the mobility μ in the coefficient part of the equation (3). Therefore, the drain-to-source current Ids is essentially dependent on the input signal voltage Vsig only. The organic EL element 11 is thus not affected by a variation or a time-dependent change in not only the threshold voltage Vth of the drive transistor 12, but also the mobility μ of the drive transistor 12, and emits light at a brightness level depending on the input signal voltage Vsig. Consequently, the display apparatus is capable of displaying images having a uniform image quality free of stripes and brightness irregularities.

Finally, at time t8, the second scanning pulse VSCAN2 output from the second vertical scanner 32 changes from the "L" level to the "H" level, rendering the switching transistor 15 nonconductive. The supply of the current from the power supply potential VDD to the drive transistor 12 is cut off, finishing the light emission period. Thereafter, a next field starts at time t9 (t1) to repeat the above sequence of threshold correction, mobility correction, and light emission.

In an active-matrix display apparatus including a matrix of pixel circuits 10, including the organic EL elements 11 as current-driven electrooptical elements, the I-V characteristics of the organic EL elements 11 change as the light emission time of the organic EL elements 11 increases. When the I-V characteristics of the organic EL elements 11 change, the potential at the junction node between the anode electrode of the organic EL elements 11 and the source of the drive transistor 12 also changes.

With the active-matrix display apparatus according to the present embodiment, however, since the gate-to-source voltage Vgs of the drive transistor 12 is kept constant, the current flowing in the organic EL element 11 does not change. Accordingly, even when the I-V characteristics of the organic EL elements 11 change, because a constant drain-to-source current Ids continuously flows in the organic EL elements 11, the light emission brightness level of the organic EL elements 11 does not change (a function to compensate for a fluctuation of the characteristics of the organic EL elements 11).

Before the input signal voltage Vsig is written, the threshold voltage Vth of the drive transistor 12 is held in advance in the capacitor 18 to cancel (correct) the threshold voltage Vth of the drive transistor 12 for thereby causing a constant drain-to-source current Ids, which is not affected by a variation or a time-dependent change per pixel of the threshold voltage Vth, to flow into the organic EL element 12. Therefore, the display apparatus is capable of displaying images of a high image quality (a function to compensate for a variation in the threshold voltage Vth of the drive transistor 12).

In the mobility correction period t6 to t7, the drain-to-source current Ids is applied to the gate of the drive transistor 12 through the negative feedback loop to correct the input signal voltage Vsig with the feedback variable ΔV. The dependency of the drain-to-source current Ids of the drive transistor 12 on the mobility μ is thus canceled out, and the drain-to-source current Ids, which depends on the input signal voltage Vsig, only flows into the organic EL element 11. Therefore, the display apparatus is capable of displaying images of a uniform image quality free of stripes and brightness irregularities that are caused by a variation or a time-dependent change per pixel of the mobility μ in the drive transistor 12 (a function to compensate for a variation or a time-dependent change per pixel of the mobility μ of the drive transistor 12).

(Layout of Pixel Circuits)

The layout of the pixel circuits 10 according to the present invention will be described below.

Embodiment 1

According to Embodiment 1, a color display apparatus emits light in R (red), G (green), B (blue) from the organic EL elements 11 of the pixel circuits 10 that are arranged in a striped array, wherein the organic EL elements 11 for producing different colors are arranged in respective stripes.

As shown in FIG. 1, the scanning lines 21 through 24 extend along the pixel rows of the pixel circuits 10 and the data lines 25 extend along the pixel columns of the pixel circuits 10. Power supply lines (not shown) for supplying the power supply potential VDD, and the power supply lines 26, 27 for supplying the power supply potentials V1, V2 extends along the pixel columns of the pixel circuits 10.

As shown in FIG. 1, the pixel array 20 includes a plurality of pairs of two horizontally adjacent pixel circuits 10 in each pixel row, and two data lines 25 are associated with the two pixel circuits 10 in each pair, which are disposed on respective opposite sides of the pair of pixel circuits 10. For example, the pixel circuit 10 (1, 1) in the first column and the pixel circuit 10 (1, 2) in the second column are paired in the first pixel row. The data line 25-1 associated with the first column is disposed one side of the pair of pixel circuits 10 (1, 1), 10 (1, 2) and the data line 25-2 associated with the second column is disposed the other side of the pair of pixel circuits 10 (1, 1), 10 (1, 2).

Figure 5:
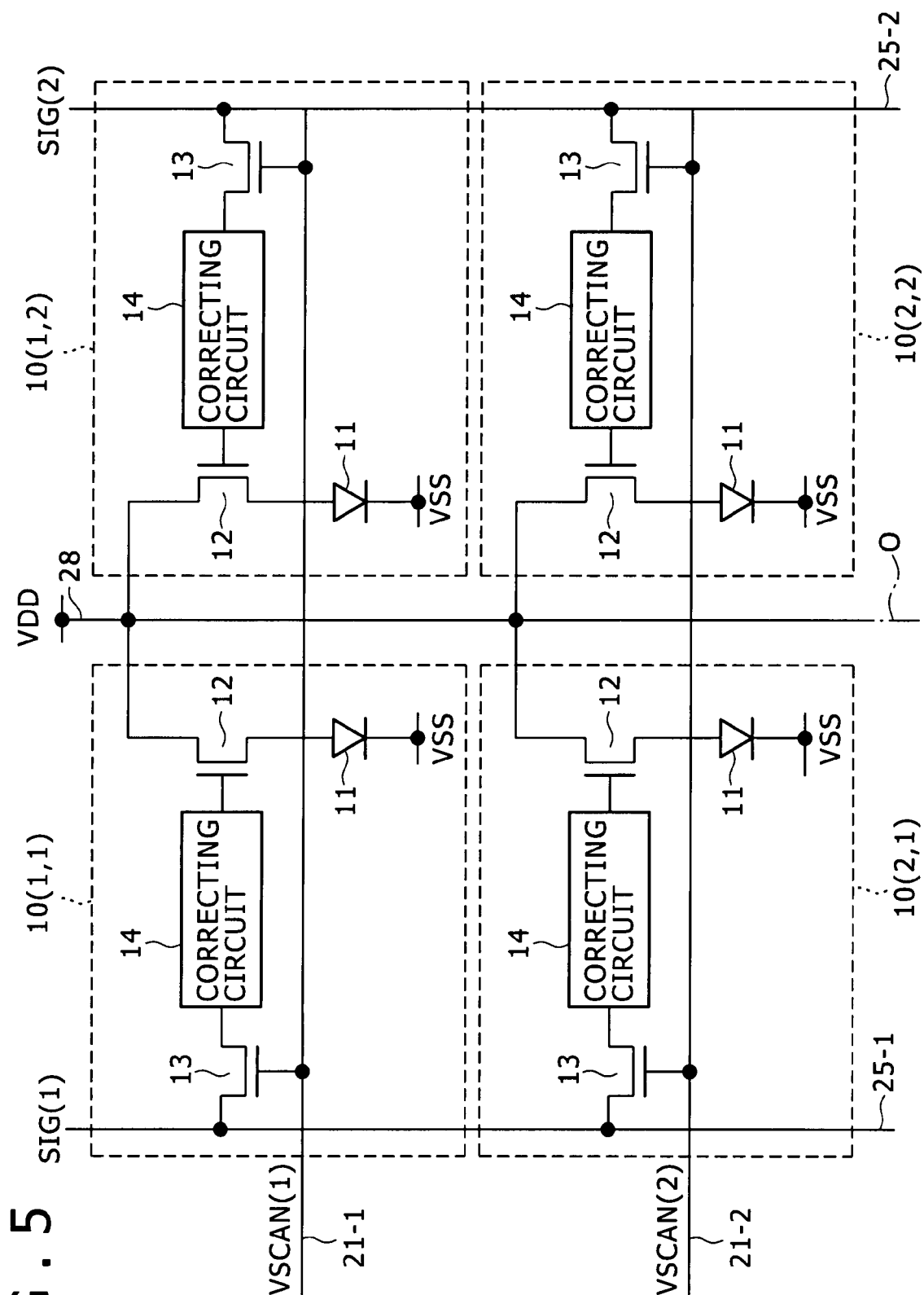
FIG. 5 is a circuit diagram showing the symmetry of a layout in a striped array according to Embodiment 1.

Since these data lines 25-1, 25-2 (see FIG. 5) are disposed on the respective opposite sides of the pair of pixel circuits 10 (1, 1) and 10 (1, 2), which are disposed adjacent to each other in the pixel row, the organic EL elements 11, the drive transistors 12, the write transistors 13, and the correcting circuits 14 in pixel circuits 10 (1, 1) and 10 (1, 2) are horizontally symmetrically laid out with respect to an intermediate line O between the pixel circuits 10 (1, 1) and 10 (1, 2).

As a result, as shown in FIG. 6, the pixel circuits 10 in the pixel array 20, which is of the striped array in the three rows and four columns, are horizontally symmetrical in shape in each unit (pair) of two adjacent pixel columns. In FIG. 6, the shape of each pixel circuit 10 is represented by the letter "F" or the inverted shape thereof for an easier understanding of the symmetrical configuration.

The "horizontally symmetrical" layout of the pixel circuits 10 covers not only a completely horizontally symmetrical layout, but also the modified horizontally symmetrical layouts as described below.

The pixel circuits 10 may have different pixel constants depending on the colors (R, G, B), which are emitted from the organic EL elements 11, and the transistors 12 through 17 and the capacitor 18 (see FIG. 3) may have different sizes because of such different pixel constants. Accordingly, the layout of the pixel circuits 10, which is determined by the sizes of the transistors 12 through 17 and the capacitor 18 may not be a completely horizontally symmetrical layout. In addition, the power supply lines 26 and 27 (see FIG. 1), used for supplying the power supply potentials V1, V2 to the pixel circuits 10 and contact holes associated with the power supply lines 26 and 27, may not have completely horizontally symmetrical patterns because the power supply potentials V1, V2 are supplied to different circuits. These modified horizontally symmetrical layouts should be interpreted to be covered by the horizontally symmetrical layout.

With the horizontally symmetrical layout of the paired pixel circuits 10 (1, 1) and 10 (1, 2), a power supply line 28 for supplying the power supply potential VDD may be disposed on the intermediate line O between an odd-numbered pixel circuit and an even-numbered pixel circuit so as to be shared by the pixel circuits 10 (1, 1) and 10 (1, 2). The layout of the paired pixel circuits 10 (1, 1) and 10 (1, 2) are thus kept symmetrical, and the area of the layout of the pixel circuits 10 is made smaller than if power supply lines 28 are provided in association with respective pixel columns.

Of the layouts of the drive transistor 12, the write transistor 13, the switching transistors 15 through 17 of each of the pixel circuits 10, and the layout of the drive transistor 12, for example, for supplying the organic EL element 11 with a current depending on the input signal voltage Vsig to enable the organic EL element 11 to emit light will be described below.

Since the drive transistor 12 includes an N-channel MOS transistor, it is general for the drive transistor 12 to have a LDD structure for the purposes of relaxing a drain electric field to increase the withstand voltage and reducing a leakage. The drive transistor 12 with the LDD structure is laid out by employing the layout structure described below.

Figure 7:
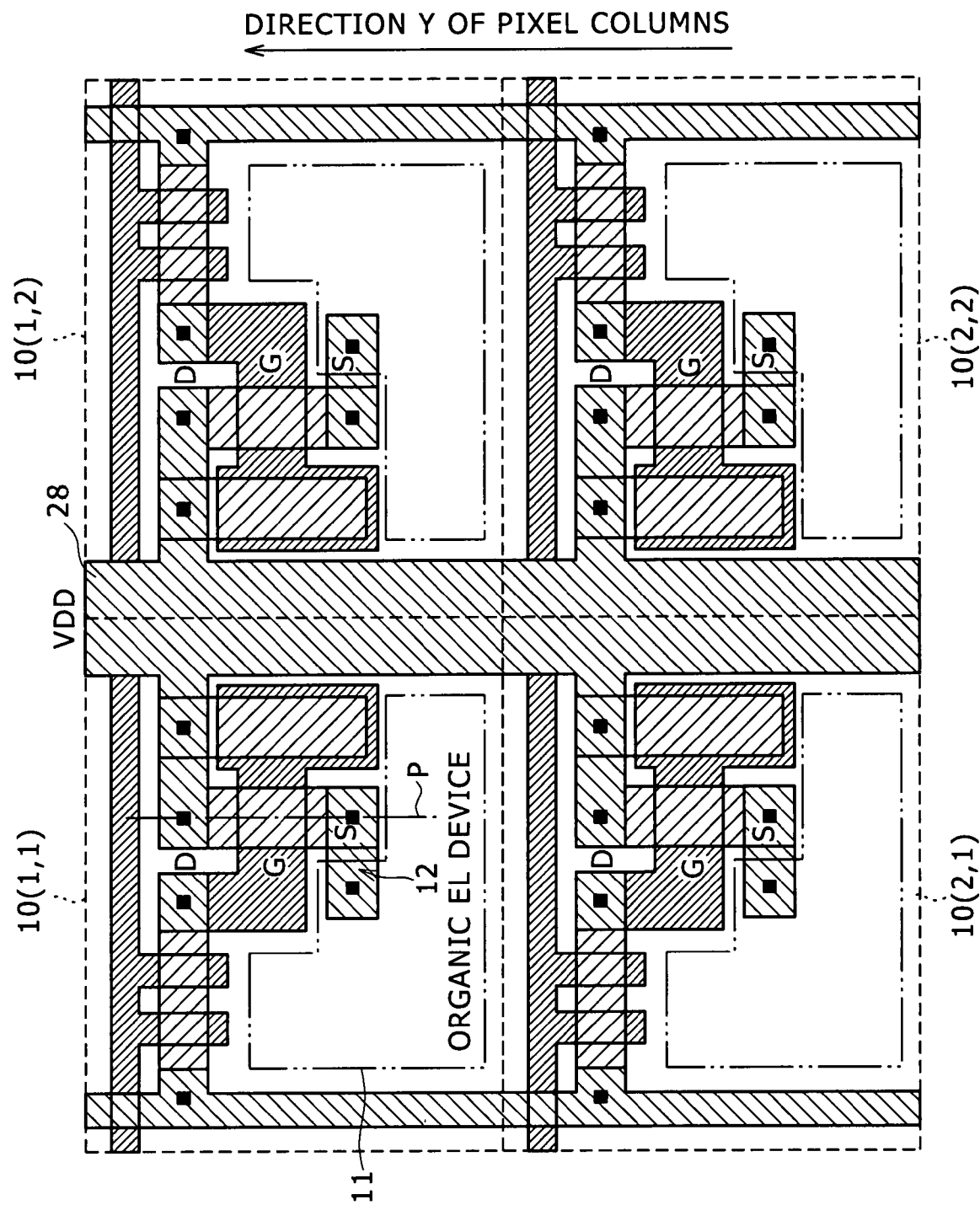
FIG. 7 is a view showing a layout structure wherein a line P interconnecting the drain and source of a drive transistor extends parallel to the direction Y of pixel columns.

As shown in FIG. 7, for laying out drive transistors 12, the drive transistors 12 are formed such that the line P interconnecting the drain regions (D) and the source regions (S) thereof extends parallel to the direction Y of the pixel columns of the pixel array 20. The drain regions (D) of the drive transistors 12 are electrically connected to the power supply line 28 for supplying the power supply potential VDD, which is shared by the drive transistors 12, and extends along the pixel column direction Y between two adjacent pixel columns (two adjacent pixel circuits 10 (1, 1) and 10 (1, 2)). The source regions (S) of the drive transistors 12 are electrically connected to the respective anode electrodes of the organic EL elements 11.

Figure 10:
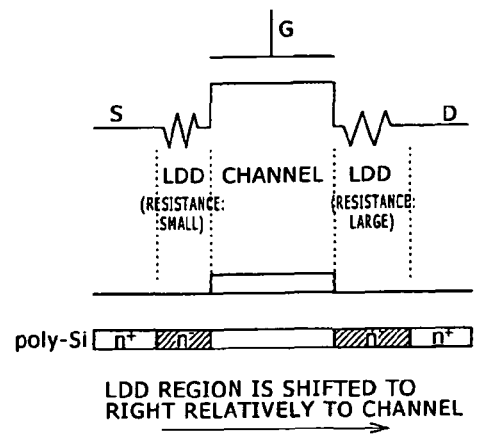
FIG. 10 is a diagram showing the relationship between resistance values at the time LDD regions are shifted with respect to a channel.
Figure 11:
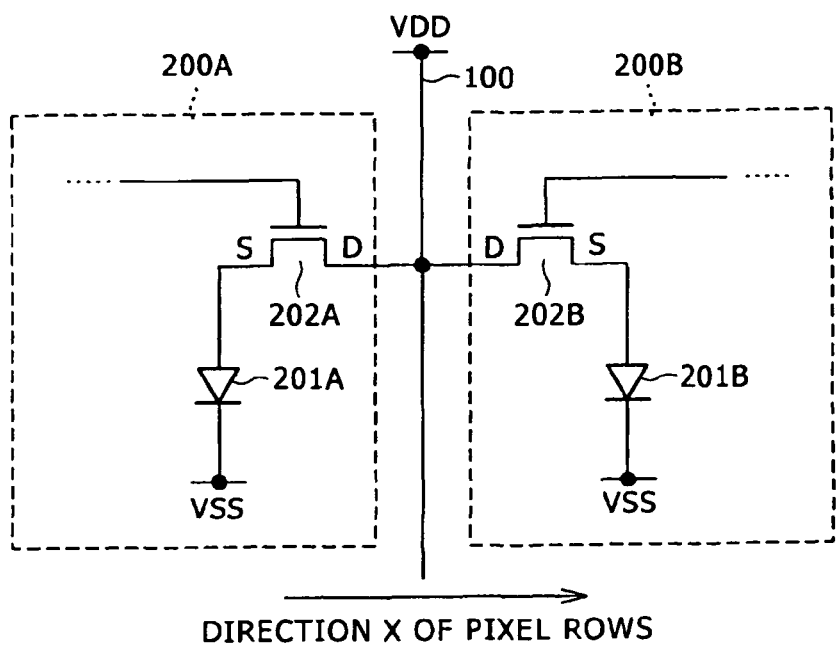
FIG. 11 is a circuit diagram showing an arrangement of pixel circuits of the related art.
Figure 12:
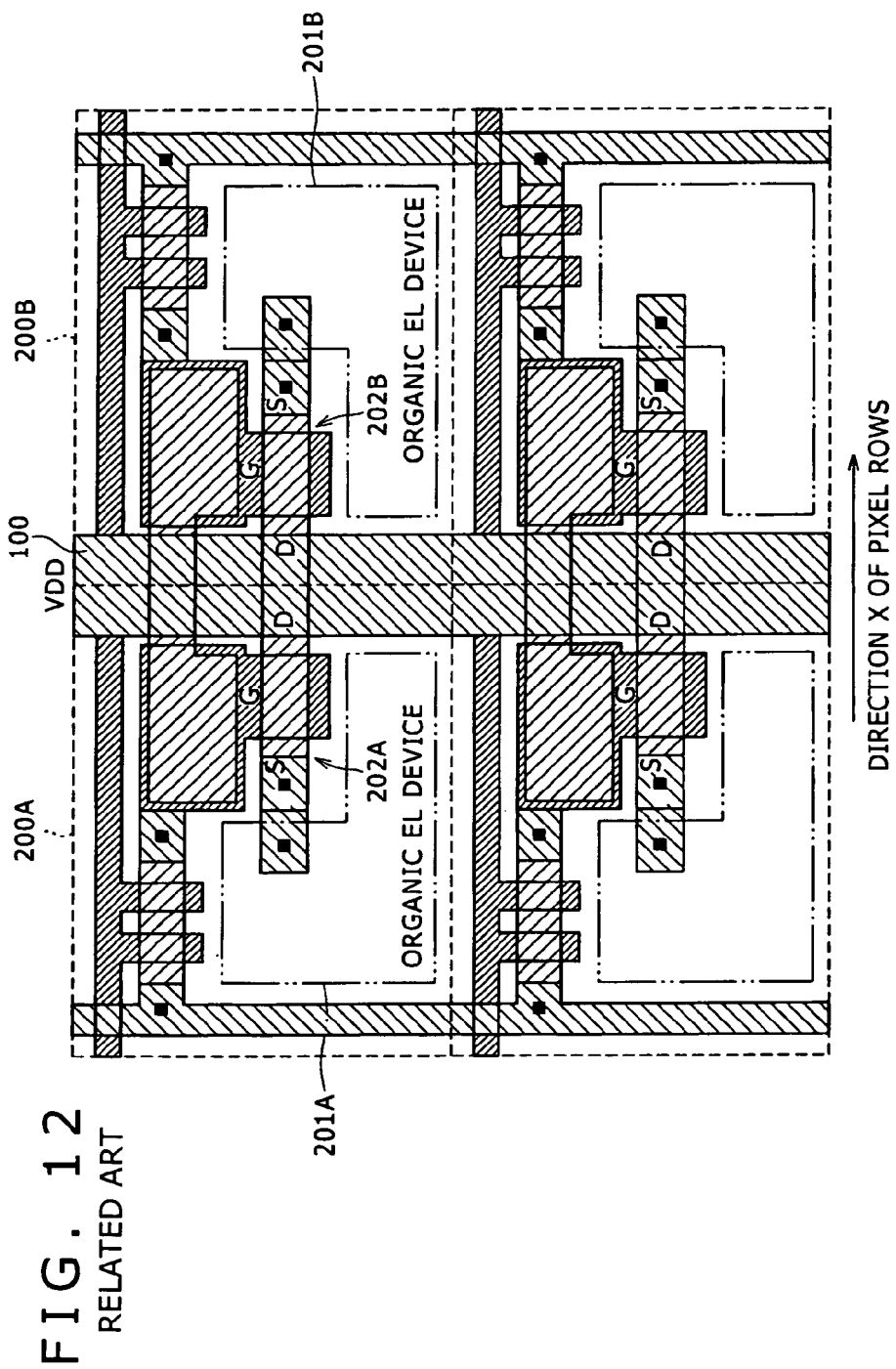
FIG. 12 is a view showing a layout structure wherein a line P interconnecting the drain and source of a drive transistor extends parallel to the direction X of pixel rows.

As described above, the two pixel circuits 10 (1, 1) and 10 (1, 2) are paired in the same pixel row, and the circuit components are laid out symmetrically with respect to the power supply line 28 between the two pixel circuits such that the line P interconnecting the drain regions (D) and the source regions (S) of transistors having the LDD structure, e.g., the drive transistors 12, extends parallel to the direction Y of pixel columns. This layout offers the following advantages:

Even if the resistance values of the LDD regions on the drain and source sides are different when the LDD regions are shifted due to a variation of the positional relationship between the LDD structure and the channel, as shown in FIG. 10, the different resistance values occur identically in the drive transistors 12 of the two pixel circuits 10 (1, 1) and 10 (1, 2).

Specifically, if the LDD region on the drain side of the drive transistor 12 of the pixel circuit 10 (1, 1) becomes longer (the resistance value thereof becomes greater) and the LDD region on the source side thereof becomes shorter (the resistance value thereof becomes smaller), then the LDD region on the drain side of the drive transistor 12 of the other pixel circuit 10 (1, 2) also becomes longer and the LDD region on the source side thereof also becomes shorter.

Conversely, if the LDD region on the drain side of the drive transistor 12 of the pixel circuit 10 (1, 1) becomes shorter and the LDD region on the source side thereof becomes longer, then the LDD region on the drain side of the drive transistor 12 of the other pixel circuit 10 (1, 2) also becomes shorter and the LDD region on the source side thereof also becomes longer. Consequently, pixel-to-pixel variations of the characteristics of the drive transistors 12 due to the shifts of the LDD regions are eliminated, with the result that the display apparatus is capable of displaying images of a high image quality free of quality deteriorations due to such pixel-to-pixel variations.

In Embodiment 1, the drive transistors 12 are laid out such that the line P interconnecting the drain regions (D) and the source regions (S) thereof extends parallel to the direction Y of the pixel columns of the pixel array 20. However, other N-channel transistors having the LDD structure, e.g., the transistors 13, 16, and 17 (see FIG. 3), may be laid out similarly.

Since the drive transistors 12 are analog transistors for supplying a current depending on the input signal voltage Vsig to the organic EL elements 11 to enable the organic EL elements 11 to emit light, characteristic variations of the drive transistors 12 have a large effect on the light emission brightness level of the organic EL elements 11. Therefore, the above layout of the drive transistors 12 is effective to prevent image quality deteriorations due to the characteristic variations of the drive transistors 12, and hence contributes greatly to the display of high-quality images.

Embodiment 2

According to Embodiment 2, a color display apparatus emits light in R (red), G (green), B (blue) from the organic EL elements 11 in pixel circuits 10 are arranged in a delta array wherein the organic EL elements 11 for producing different colors are arranged in triangular shapes with adjacent pixel rows displaced by ½ pixel pitch.

Figure 8:
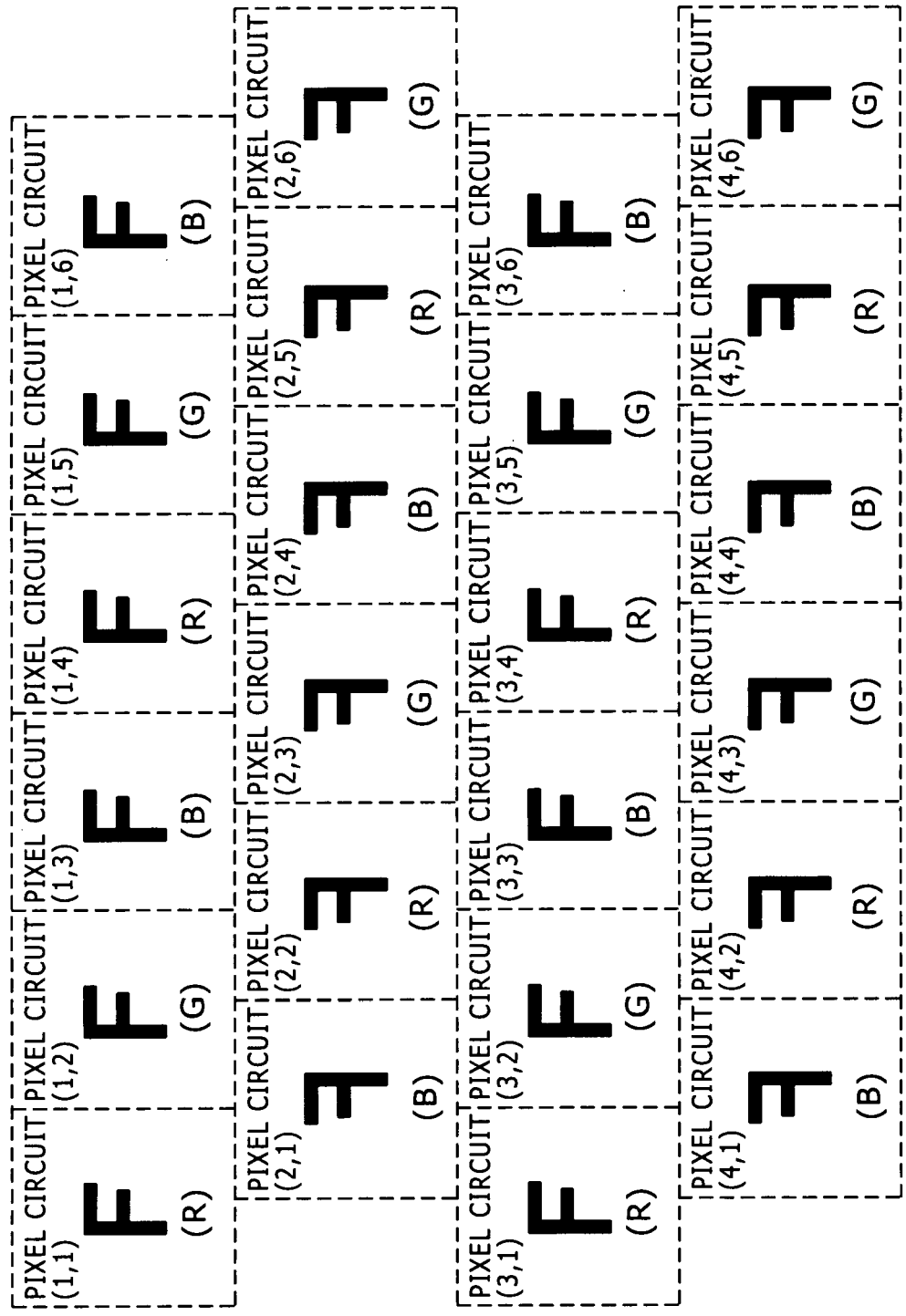
FIG. 8 is a diagram showing the layouts of pixel circuits in a delta array.

According to the delta array of the pixel circuits 10, as shown in FIG. 8, the pixel circuits in two adjacent pixel rows, i.e., upper and lower pixel rows, are laid out in opposite directions. In FIG. 8, the shape of each pixel circuit 10 is represented by the letter "F", or the inverted shape thereof, for an easier understanding of the layout.

Figure 9:
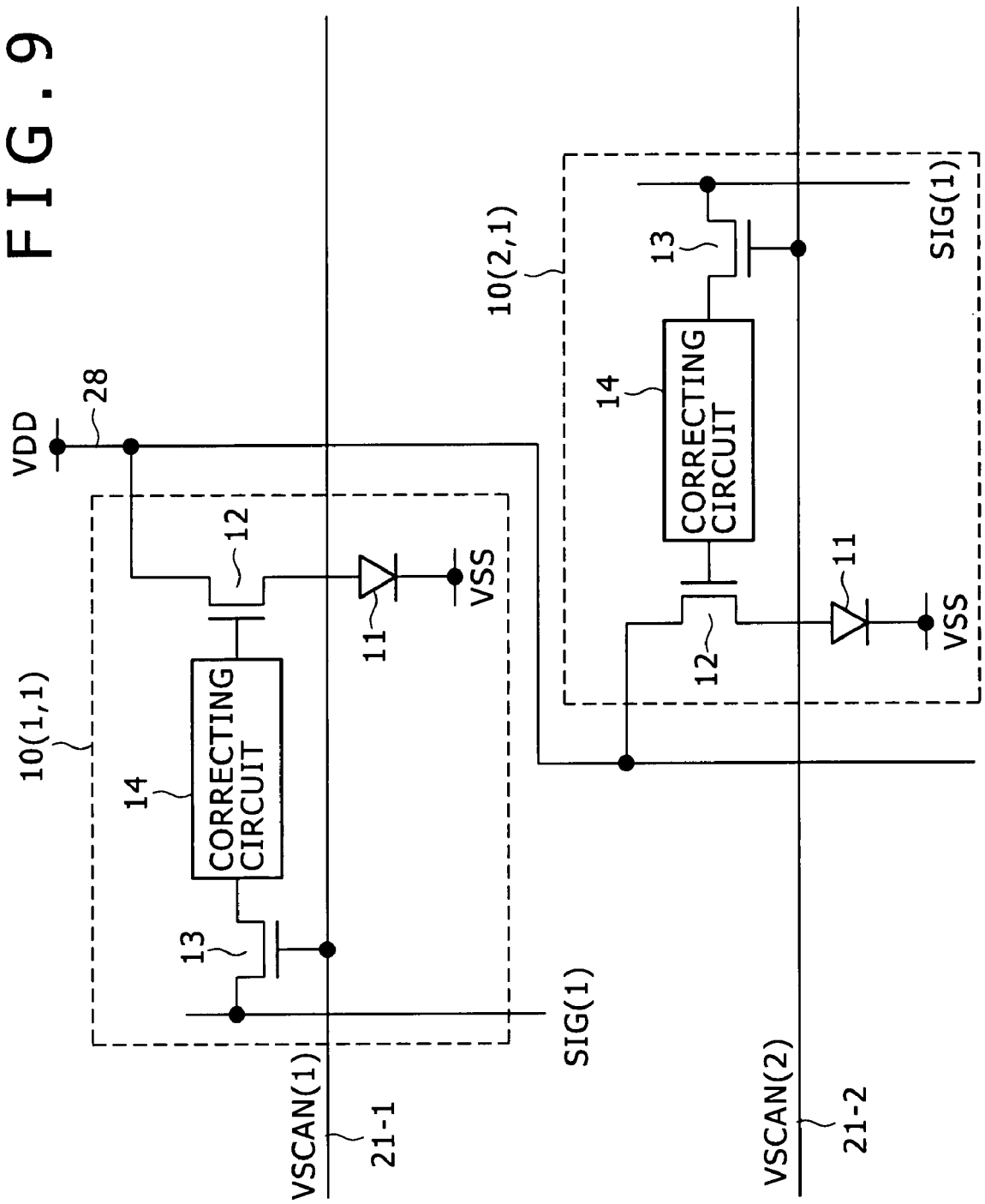
FIG. 9 is a circuit diagram showing the symmetry of a layout in a delta array according to Embodiment 2.

In the two adjacent pixel rows, i.e., the upper and lower pixel rows, two obliquely adjacent pixel circuits of either an R pixel circuit and a B pixel circuit, or a G pixel circuit and an R pixel circuit, or a B pixel circuit and a G pixel circuit, are paired with each other. For example, a pixel circuit 10 (1, 1) in the first column and the first row, and a pixel circuit (1, 2) in the first column and the second row, are paired with each other, and, as shown in FIG. 9, a power supply line 28 for supplying the power supply potential VDD is shared by the pixel circuit 10 (1, 1) and the pixel circuit (1, 2). As with the striped array, the area of the layout of the pixel circuits 10 is made smaller than if power supply lines 28 are provided in association with respective pixel columns.

For laying out drive transistors 12 in the delta array, as with the striped array, the drive transistors 12 are formed such that the line P interconnecting the drain regions (D) and the source regions (S) thereof extends parallel to the direction Y of the pixel columns of the pixel array 20 (see FIG. 7).

As described above, the two obliquely adjacent pixel circuits 10 (1, 1) and 10 (2, 2) are paired in the two adjacent pixel rows, i.e., the upper and lower pixel rows, and the circuit components are laid out symmetrically with respect to the power supply line 28 between the two pixel circuits such that the line P interconnecting the drain regions (D) and the source regions (S) of transistors having the LDD structure, e.g., the drive transistors 12, extends parallel to the direction Y of pixel columns. As with Embodiment 1, pixel-to-pixel variations of the characteristics of the drive transistors 12 due to the shifts of the LDD regions are eliminated, with the resultant display apparatus being capable of displaying images of a high image quality free of quality deteriorations due to such pixel-to-pixel variations.

As with Embodiment 1, the above layout is not limited to the drive transistors 12. Other N-channel transistors having the LDD structure, e.g., the transistors 13, 16, and 17 (see FIG. 3), may be laid out similarly.

In the above exemplary embodiment, the present invention has been described as being applied to transistors having the LDD structure. However, the present invention is not limited to transistors having the LDD structure, but is also applicable to all transistors having a low-concentration source/drain region, such as transistors having the DDD structure and transistors having the GDD structure, and transistors having offset regions of the offset gate structure.

The pixel circuits 10 according to the exemplary embodiment are shown by way of example only. The present invention is also applicable to a display apparatus comprising a matrix of pixel circuits each including at least a drive transistor 12, a write transistor 13, and a capacitor 18 in addition to an organic EL element 11.

The present invention has been described as being applied to display apparatus including pixel circuits for displaying the three primary colors (R, G, B). Since the present invention is concerned with the layout of pixel circuits, but not color arrangements, the present invention is also applicable to monochromatic display apparatus and color display apparatus having other primary color arrays and complementary color arrays (e.g., yellow, cyan, magenta, and green).

In the above exemplary embodiment, the present invention has been described as being applied to an organic EL display apparatus, wherein organic EL elements are employed as electrooptical elements in the pixel circuits 10. However, the present invention is also applicable to all display apparatus employing current-driven electrooptical elements (light-emitting elements) whose light emission brightness level changes depending on the current flowing therethrough.

While preferred embodiments of the present invention have been described using specific terms, such description is for illustrative purpose only. It is obvious that changes and variations may be made by those skilled in the art without departing from the gist of claims. Therefore, the changes and variations are understood to be contained in the spirit or scope of the claims that follow.

What is claimed is:

1. A display apparatus having a layout, the display apparatus comprising:
   source and drain semiconductor regions of a first drive transistor physically disposed along a first imaginary line, said drain region of the first drive transistor being electrically connected to a power supply line;
   source and drain semiconductor regions of a second drive transistor physically disposed along a second imaginary line, said drain region of the second drive transistor being electrically connected to said power supply line,
   wherein said power supply line extends in a pixel column direction in a plan view of the layout, said first and second imaginary lines being in said pixel column direction; wherein said first and second drive transistors are in geometric symmetry with respect to said power supply line, said power supply line being an axis of said geometrical symmetry;
   wherein a gate of the first drive transistor is electrically connected to a first correcting circuit, said first correcting circuit being configured to correct variations in the threshold voltage of the first drive transistor;
   wherein a gate of the second drive transistor is electrically connected to a second correcting circuit, said second correcting circuit being configured to correct variations in the threshold voltage of the second drive transistor.

2. The display apparatus according to claim 1, wherein said source semiconductor region of the first drive transistor is electrically connected to a first electrooptical element.

3. The display apparatus according to claim 2, wherein said first electrooptical element is configured to emit light.

4. The display apparatus according to claim 1, wherein said source semiconductor region of the second drive transistor is electrically connected to a second electrooptical element.

5. The display apparatus according to claim 4, wherein said second electrooptical element is configured to emit light.

6. The display apparatus according to claim 1, wherein said first correcting circuit is electrically connected between a first write transistor and said first drive transistor.

7. The display apparatus according to claim 1, wherein said second correcting circuit is electrically connected between a second write transistor and said second drive transistor.

8. The display apparatus according to claim 1, wherein said power supply line is between said drain semiconductor region of said first drive transistor and said drain semiconductor region of said second drive transistor.

9. The display apparatus according to claim 1, wherein said power supply line is configured to supply a power supply potential.

10. The display apparatus according to claim 1, wherein said power supply line is between a first data line and a second data line, said first and second data lines extending along said pixel column direction.

11. The display apparatus according to claim 10, wherein a scanning pulse controls a transfer of a first data signal from said first data line to said first drive transistor, a scanning line is configured to supply said scanning pulse.

12. The display apparatus according to claim 11, wherein said scanning pulse controls a transfer of a second data signal from said second data line to said second drive transistor.

13. The display apparatus according to claim 11, wherein said scanning line extends along a pixel row direction, said pixel row direction differing from said pixel column direction.

14. The display apparatus according to claim 1, wherein said first imaginary line interconnects said source and drain semiconductor regions of the first drive transistor.

15. The display apparatus according to claim 1, wherein said second imaginary line interconnects said source and drain semiconductor regions of the second drive transistor.

16. The display apparatus according to claim 1, wherein said first imaginary line is in parallel with said power supply line, said power supply line being in parallel with said second imaginary line.

* * * * *